(12) United States Patent
Zaldivar et al.

(10) Patent No.: US 11,762,301 B2
(45) Date of Patent: *Sep. 19, 2023

(54) SYSTEMS AND METHODS FOR GAMMA RADIATION BASED STABILIZATION OF REPLICATED MIRROR STRUCTURES AT THE NANOMETER-SCALE

(71) Applicant: The Aerospace Corporation, El Segundo, CA (US)

(72) Inventors: Rafael J. Zaldivar, Redondo Beach, CA (US); Geena L. Ferrelli, Los Angeles, CA (US); Hyun I. Kim, Brea, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/379,753

(22) Filed: Jul. 19, 2021

(65) Prior Publication Data
US 2021/0349401 A1     Nov. 11, 2021

Related U.S. Application Data

(63) Continuation-in-part of application No. 16/042,997, filed on Jul. 23, 2018, now Pat. No. 11,125,669.

(51) Int. Cl.
*G03F 7/20* (2006.01)
*G03F 7/00* (2006.01)

(52) U.S. Cl.
CPC ........ *G03F 7/70558* (2013.01); *G03F 7/7085* (2013.01)

(58) Field of Classification Search
None
See application file for complete search history.

(56) References Cited

PUBLICATIONS

Hun (KR20180075122 (Machine translation provided)) (Year: 2018).*
English language abstract of Hun (KR20180075122) (Year: 2018).

* cited by examiner

*Primary Examiner* — Robert J Grun
(74) *Attorney, Agent, or Firm* — Morgan, Lewis & Bockius LLP

(57) ABSTRACT

An assembly comprises an exposure chamber configured to receive a structure and identify at least one portion of the structure for further processing. The exposure chamber is further configured to expose the at least one portion of the structure to radiation such that a high cure state and a low residual stress are achieved for the structure. A dosage level of the radiation is determined based, at least in part, on the composition of the structure.

20 Claims, 10 Drawing Sheets

SYSTEMS AND METHODS FOR GAMMA RADIATION BASED STABILIZATION OF REPLICATED MIRROR STRUCTURES AT THE NANOMETER-SCALE

CROSS-REFERENCE TO RELATED APPLICATIONS

This application is a continuation-in-part application of and claims priority to U.S. patent application Ser. No. 16/042,997, filed on Jul. 23, 2018, the entirety of which is herein incorporated by reference.

BACKGROUND

Replication techniques enable the design of light weight mirror structures that have precision applications in various fields, such as space technology. At least some known replication processes involve incorporating a material substrate, such as a pure resin layer, between a pre-manufactured composite substrate and an optical quality mandrel coated with a mold release coating. The resin is cured and thus "replicates" the surface of the mandrel, while bonding to the composite surface. As the resin layer reaches a higher cure state, it becomes solid and increases in density. Higher cure states also result in increased hygrothermal stability, higher glass transition temperature (Tg), higher modulus, and lower moisture absorption.

At least some known techniques for curing involve elevated temperature curing, wherein a material substrate is exposed to high temperatures before cooling to ambient temperature. However, elevated temperature curing involves cycling from high to low temperatures repeatedly. This type of cycling can be detrimental to bonded layer structures, such as replicated mirrors. For example, there can be residual stress caused by thermal expansion variations. This residual stress results in a deviation from the planar form and a higher surface figure error (SFE) in the bonded layer structures. In addition, the amount of exposure time required for temperature based curing further causes higher SFE and planar form deviation. Therefore, elevated temperature curing techniques cannot be used to achieve a high cure state without causing warping of the replicated mirrors and large SFE. Although low temperature curing techniques exist that involve the use of ultra violet (UV) radiation, the level of cure state that can be reached using UV radiation is limited due to the relatively low energy and low penetration depth of UV rays.

At least some known techniques for curing organic resins involve radiation exposure, such as ultra violet (UV) or even higher energy radiation including x-ray or gamma. However, not all resin formulations react the same way with the impinging radiation. Some resin formulations undergo chain scission and fragmentation in the polymer backbone while others undergo cross-linking. Chain scissions could have the effect of degrading the mechanical capability the material, but it could also have the effect of reducing the residual stress in the material depending on the magnitude of the chain scission. Both chain scission and cross-linking reactions may take place concurrently in most resin systems. However, resin formulations in which fragmentation dominates over cross-linking result in net chain-scission and degradation in the resin properties during the curing. Resin formulations in which cross-linking dominates over chain scission result in net increase in cure state while reducing residual stress. Therefore, in radiation curing, it is critical to select a resin formulation that will result in the desired enhanced properties without significant fragmentation.

SUMMARY OF THE INVENTION

The embodiments described herein provide a low temperature curing process that enables the achievement of a high cure state and a low residual stress in a material substrate, which can enable the material substrate to have increased dimensional stability, higher Tg, higher modulus, and lower moisture absorption. For example, in one embodiment, a curing assembly is provided. The curing assembly includes a first exposure chamber configured to receive a composite article that includes a first substrate layer, a second substrate layer, and at least one material substrate layer that is configured to be positioned between the first substrate layer and the second substrate layer. The curing assembly may identify at least one portion of the material substrate layer for further processing; and expose the portion of the material substrate layer to Gamma radiation such that a relatively high cure state and a low residual stress are achieved for the material substrate layer, wherein a dosage level of the Gamma radiation is based, at least in part, on at least one composition of the material substrate layer.

In another embodiment, a method is provided. The method comprises receiving a composite article that includes a first substrate layer, a second substrate layer, and at least one material substrate layer that is configured to be positioned between the first substrate layer and the second substrate layer. At least one portion of the material substrate layer is identified for further processing; and the identified portion is exposed to Gamma radiation such that a relatively high cure state and a low residual stress are achieved for the material substrate layer, wherein a dosage level of the Gamma radiation is based, at least in part, on at least one composition of the material substrate layer.

In yet other embodiments, a system is provided. The system comprises a control system and a curing assembly. The curing assembly includes a first exposure chamber configured to receive a composite article that includes a first substrate layer, a second substrate layer, and at least one material substrate layer that is configured to be positioned between the first substrate layer and the second substrate layer. The curing assembly may identify at least one portion of the material substrate layer for further processing; and expose the portion of the material substrate layer to Gamma radiation such that a relatively high cure state and a low residual stress are achieved for the material substrate layer, wherein a dosage level of the Gamma radiation is based, at least in part, on at least one composition of the material substrate layer.

In some embodiments, an assembly is provided. The assembly comprises an exposure chamber configured to receive a structure and identify at least one portion of the structure for further processing. The exposure chamber is further configured to expose the at least one portion of the structure to radiation such that a high cure state and a low residual stress are achieved for the structure. A dosage level of the radiation is determined based, at least in part, on the composition of the structure.

In some embodiments, a method is provided. The method comprises receiving a structure and identifying at least one portion of the structure for further processing. The method further comprises exposing the at least one portion of the structure to radiation such that a high cure state and a low residual stress are achieved for the structure. A dosage level of the radiation is determined based, at least in part, on the composition of the structure.

In some embodiments, a system is provided. The system comprises a control system and an assembly. The assembly comprises an exposure chamber configured to receive a structure and identify at least one portion of the structure for further processing. The exposure chamber is further configured to expose the at least one portion of the structure to radiation such that a high cure state and a low residual stress are achieved for the structure. A dosage level of the radiation is determined based, at least in part, on the composition of the structure.

DETAILED DESCRIPTION

As discussed above, replication using elevated temperature curing involves exposing a material substrate to be cured to high temperatures, which can result in warping of the replicated structures and large SFE due to temperature induced residual stress. Low temperature curing techniques involve exposure of the material to ultra violet (UV) radiation, however the level of cure state that can be reached using UV radiation is limited. The embodiments described herein enable the low temperature curing of material substrates while achieving a high cure state and a low residual stress without significant degradation or fragmentation of the cross-links in those material substrates during replication. By increasing the net cross-linking while reducing the degree of chain-scission due to radiation exposure, mechanical capability of the material is enhanced while the residual stress in the replicated layers that result from the curing process is lowered. As such, structures created using replication technology will exhibit high dimensional stability, and will also have high Tg, higher modulus, and lower moisture absorption. The embodiments described herein include, for example, curing of a material substrate by utilizing Gamma radiation exposure in conjunction with UV radiation exposure in order to achieve a high cure state and a low residual stress in the material substrate. Other embodiments described herein include mixing an amount of nanoparticles into a material substrate, and curing the material substrate using Gamma radiation exposure in order to achieve a high cure state in the material substrate without exposing the substrate to high temperatures. It should be noted that the present disclosure is not limited to any particular type of material substrate and one of ordinary skill in the art will appreciate that the current disclosure may be used in connection with other types of systems that are used to cure various types of material substrates.

Figure 1:
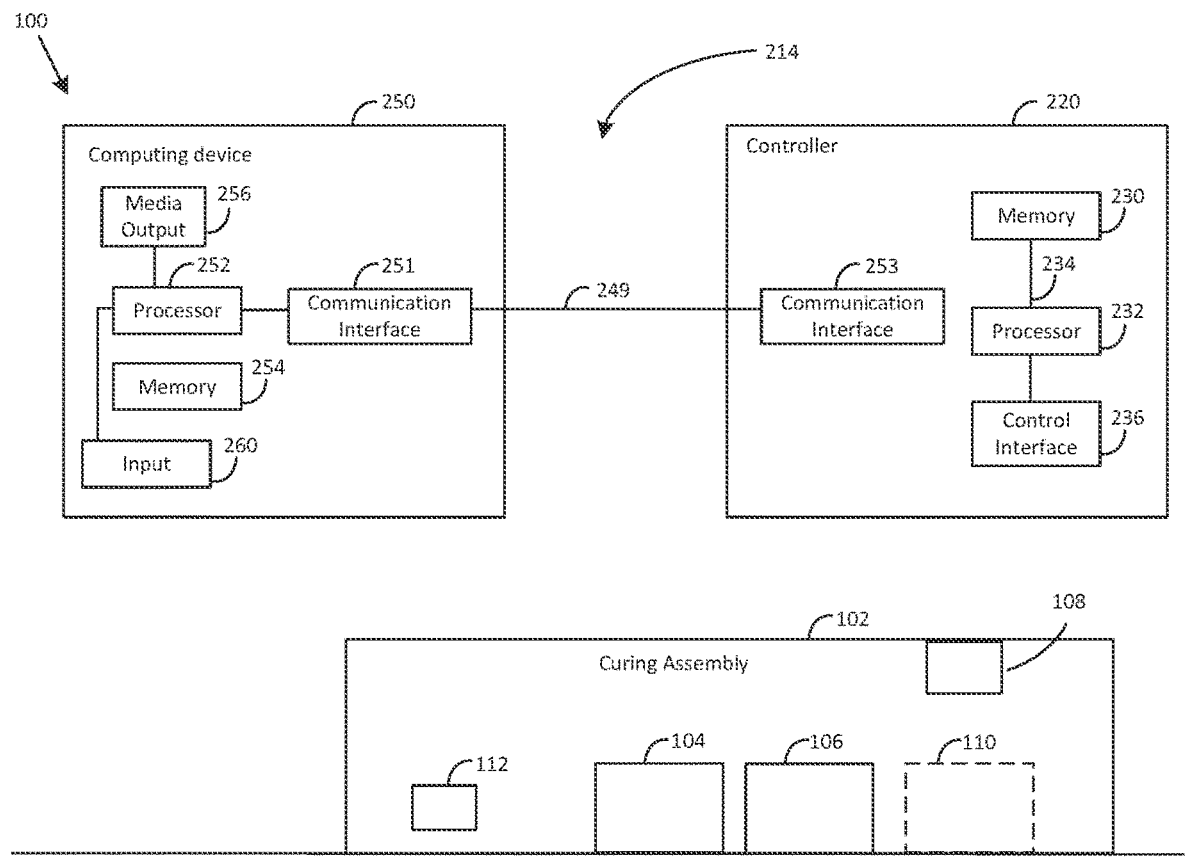
FIG. 1 is block diagram of an exemplary system in accordance with some embodiments of the present disclosure.

FIG. 1 illustrates an exemplary system 100. In some embodiments, system 100 can be a system for curing a material substrate, such as material substrate 112. Material substrate 112 may be a resin, or an epoxy or any other material suitable for replication. In some embodiments, system 100 may include a curing assembly 102 and a control system 214. Curing assembly 102 may include a UV radiation exposure chamber 104, a Gamma radiation exposure chamber 106, and a cure state monitor 108. Gamma radiation exposure chamber 106 may comprise a non-oxidizing environment. For example, Gamma radiation chamber 106 is a nitrogen heavy environment.

In some embodiments, control system 214 is coupled to curing assembly 102. Control system 214 can be configured to control various operational parameters, such as Gamma and UV radiation dosage, as well as exposure time within Gamma radiation exposure chamber 106 and UV radiation exposure chamber 104. In some embodiments, control system 214 includes a controller 220 that is operatively coupled to vary the operation of Gamma radiation exposure chamber 106 and UV radiation exposure chamber 104, as a function of values determined from cure state monitor 108, which may be configured to determine the material properties of a material substrate that is to be cured using system 100. In some embodiments, control system 214 may receive such information from a user (as described in more detail herein). In some embodiments, controller 220 is enabled to facilitate operative features of each of the exposure chambers, via features that include, without limitation, receiving inputs, transmitting outputs, and transmitting control parameters. For example, controller 220 is enabled to independently control the dosage of Gamma radiation within Gamma radiation exposure chamber 106, the dosage of UV radiation within UV radiation exposure chamber 104, and the exposure time of each chamber by transmitting control parameters to each chamber based on inputs received from cure state monitor 108. In some embodiments, controller 220 may generate control parameters based on user input received via communication interface 253.

In some embodiments, controller 220 can be a real-time controller and can include any suitable processor-based or microprocessor-based system, such as a computer system, that includes microcontrollers, reduced instruction set circuits ("RISC"), application-specific integrated circuits ("ASICs"), logic circuits, and/or any other circuit or processor that is capable of executing the functions described herein. In one embodiment, controller 220 can be a microprocessor that includes read-only memory ("ROM") and/or random access memory ("RAM"), such as, for example, a 32 bit microcomputer with 2 Mbit ROM and 64 Kbit RAM. As used herein, the term "real-time" refers to outcomes occurring in a substantially short period of time after a change in the inputs affect the outcome, with the time period being a design parameter that can be selected based on the importance of the outcome and/or the capability of the system processing the inputs to generate the outcome.

In some embodiments, controller 220 includes a memory device 230 that stores executable instructions and/or one or more operating parameters representing and/or indicating an operating condition of Gamma radiation exposure chamber 106 and UV radiation exposure chamber 104. Controller 220 also includes a processor 232 that is coupled to memory device 230 via a system bus 234. In some embodiments, processor 232 can include a processing unit, such as, without limitation, an integrated circuit ("IC"), an application specific integrated circuit ("ASIC"), a microcomputer, a programmable logic controller ("PLC"), and/or any other programmable circuit. Alternatively, processor 232 can include multiple processing units (e.g., in a multi-core configuration). The above examples are exemplary only, and thus are not intended to limit in any way the definition and/or meaning of the term "processor."

Moreover, in some embodiments, controller 220 includes a control interface 236 that is configured to couple to curing assembly 102. Processor 232 may be programmed to generate one or more control parameters that are transmitted to control interface 236. More specifically, in response to receiving (via control interface 236) information from cure state monitor 108 about the material properties of material substrate 112, processor 232 may execute one or more instructions stored in memory 230 in order to generate control parameters based on the material property information. Material property information may include information regarding the chemical properties and chemical ratios of material substrate 112, as well as the material properties required of the material substrate 112 for a particular application. The material properties required may include for example: cure state, residual stress, and surface flatness among others. Control interface 236 may then transmit the one or more control parameters to the curing assembly 102 so as to begin the process of curing the material substrate. In some embodiments, processor 232 may receive material property information from a user, as described in more detail herein.

Various connections are available between control interface 236 and curing assembly 102. Such connections can include, without limitation, an electrical conductor, a low-level serial data connection, such as Recommended Standard ("RS") 232 or RS-485, a high-level serial data connection, such as USB, a field bus, a PROFIBUS®, or Institute of Electrical and Electronics Engineers ("IEEE") 1394 (a/k/a FIREWIRE), a parallel data connection, such as IEEE 1284 or IEEE 488, a short-range wireless communication channel (personal area network) such as BLUETOOTH, and/or a private (e.g., inaccessible outside system 100) network connection, whether wired or wireless. PROFIBUS is a registered trademark of Profibus Trade Organization of Scottsdale, Ariz. IEEE is a registered trademark of the Institute of Electrical and Electronics Engineers, Inc., of New York, N.Y. BLUETOOTH is a registered trademark of Bluetooth SIG, Inc. of Kirkland, Wash.

In some embodiments, control system 214 can also include a user computing device 250 that is coupled to controller 220 via a network 249. More specifically, computing device 250 includes a communication interface 251 that is coupled to a communication interface 253 contained within controller 220 via network 249. User computing device 250 includes a processor 252 for executing instructions. In some embodiments, executable instructions are stored in a memory device 254. Processor 252 can include one or more processing units (e.g., in a multi-core configuration). Memory device 254 is any device allowing information, such as executable instructions and/or other data, to be stored and retrieved. User computing device 250 also includes at least one media output component 256 for use in presenting information to a user. Media output component 256 is any component capable of conveying information to the user. Media output component 256 can include, without limitation, a display device (not shown) (e.g., a liquid crystal display (LCD), an organic light emitting diode (OLED) display, or an audio output device (e.g., a speaker or headphones)).

Moreover, in some embodiments, user computing device 250 includes an input interface 260 for receiving input from a user. Input interface 260 can include, for example, a keyboard, a pointing device, a mouse, a stylus, a touch sensitive panel (e.g., a touch pad or a touch screen), a gyroscope, an accelerometer, a position detector, and/or an audio input device. A single component, such as a touch screen, can function as both an output device of media output component 256 and input interface 260.

In some embodiments, material substrate 112 is received at the curing assembly 102. In some embodiments, material substrate 112 may be incorporated into a composite article (not shown) having a first substrate layer and a second substrate layer. For example, material substrate 112 is sandwiched between the first substrate layer and the second substrate layer of the composite article. In some embodiments, the first substrate layer may be a mandrel and the second substrate layer may be a composite substrate. Control system 214 may receive material property information pertaining to the chemical composition and chemical ratios of material substrate 112, as well as the material properties required of material substrate 112 for a particular application from a user via user input 260. The material properties required may include for example: cure state, residual stress, and surface flatness among others. For example, a user indicates the material property information of material substrate 112 via the user input 260 and computing device 250 transmits the material property information to the controller 220 via communication interface 251. Based on the material property information received via communication interface 253, control system 214 may determine (via controller 220) a UV radiation dosage level and exposure time. More specifically, processor 232 may execute one or more instructions stored in memory 230 in order to generate one or more control parameters corresponding to the UV radiation dosage level and exposure time based on the material property information received from the user, and transmit the one or more control parameters to the curing assembly 102.

In some embodiments, control system 214 may utilize cure state monitor 108 to determine the material property information of the material substrate. Cure state monitor 108 may be any suitable type of cure state monitor including, by way of example only, an optical fiber cure state monitor, which may also be configured to characterize the chemical composition of material substrate 112 using spectroscopy, a dielectric sensor based cure state monitor, an ultrasonic cure state monitor, or a thermal cure state monitor. Upon determining the chemical composition and chemical ratios of the material substrate, cure state monitor 108 may provide this information to control system 214 via the control interface 236. Based on the material property information received from cure state monitor 108, control system 214 may determine (via controller 220) a UV radiation dosage level and exposure time. More specifically, processor 232 may execute one or more instructions stored in memory 230 in order to generate one or more control parameters corresponding to the UV radiation dosage level and exposure time based on the material property information received from the cure state monitor 108, and transmit the one or more control parameters to the curing assembly 102 via the control interface 236.

Figure 2A:
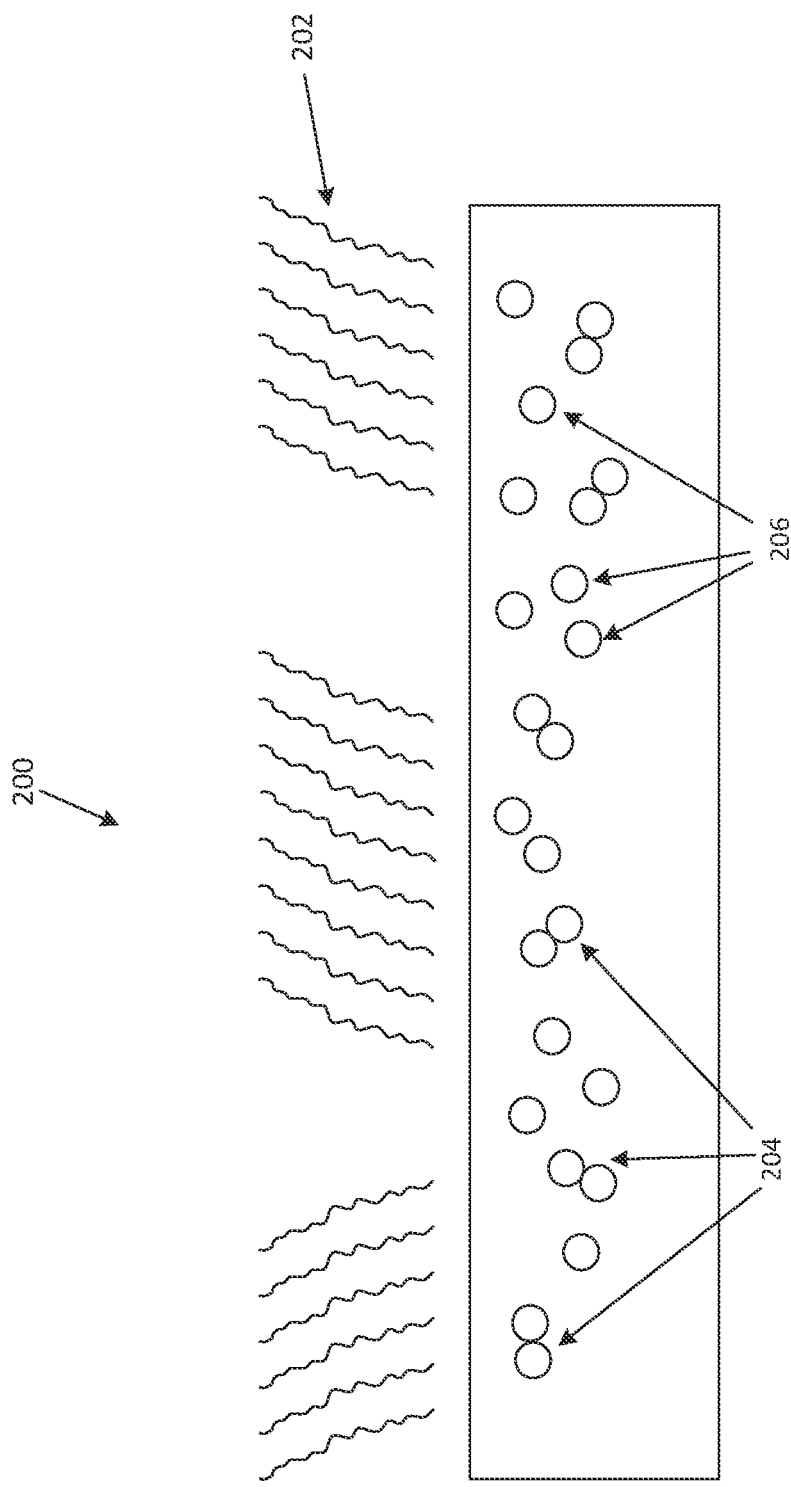
FIG. 2A is a perspective view of a material substrate, wherein the monomers within the material substrate are partially cross linked, in accordance with some embodiments of the present disclosure.

In some embodiments, UV radiation exposure chamber 104 may expose the material substrate 112 to UV radiation. The dosage level and time of the exposure may be based, at least in part, on the one or more control parameters received from the control system 214. As exposure to UV radiation continues, the cure state of the material substrate may begin increasing. More specifically, monomers within the material substrate may begin cross-linking, which facilitates the process by which the material substrate may transition from a liquid to a solid, while increasing in density (curing process). The exposure to UV radiation may activate photo-initiator particles within the material substrate, which promotes cross linking of the monomers. However, UV rays have a relatively low energy and the penetration depth of UV rays is small. In addition, a line of sight between the rays and the monomers is required. Therefore, the amount of cross-linking that may occur as a result of exposure to UV radiation is limited due to the inability of UV radiation to activate all photo-initiating groups available. FIG. 2A shows the material substrate 112 of FIG. 1, after exposure to UV radiation 202. As can be seen, material substrate 112 is only partially cross-linked, with monomers 204 being cross linked, while monomers 206 are as of yet not cross-linked.

Referring back to FIG. 1, cure state monitor 108 may continuously monitor the cure state of material substrate 112 during UV radiation exposure and may provide updates on the cure state of material substrate 112 to control system 214 at regular intervals. In some embodiments, upon completion of the UV radiation exposure, control system 214 may determine a Gamma radiation dosage level and time of exposure based on the material property information and a post-UV cure state of material substrate 112, as reported by cure state monitor 108. More specifically, processor 232 may execute one or more instructions stored in memory 230 in order to generate one or more control parameters corresponding to the Gamma radiation dosage level and exposure time based on the material property information and the post-UV cure state received from the cure state monitor 108, and transmit the one or more control parameters to the curing assembly 102.

Figure 2B:
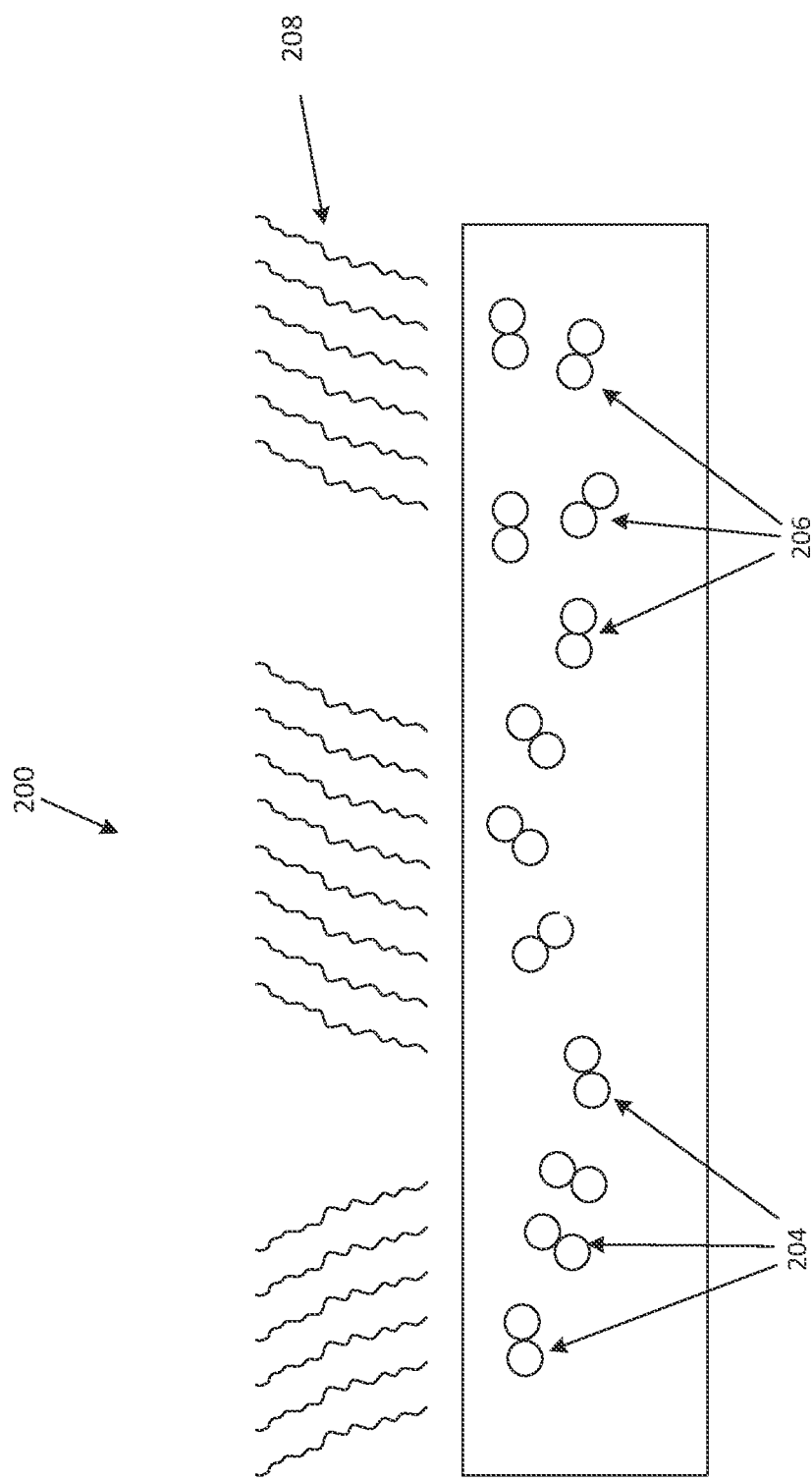
FIG. 2B is a perspective view of the material substrate shown in FIG. 2A, wherein the monomers within the material substrate are fully cross linked, in accordance with some embodiments of the present disclosure.

In some embodiments, Gamma radiation chamber 106 may expose the material substrate 112 to Gamma radiation. As with the UV radiation exposure, the dosage level and time of the Gamma radiation exposure may be based, at least in part, on the one or more control parameters corresponding to the Gamma radiation dosage level and exposure time received from the control system 214. Gamma radiation chamber 106 may provide a uniform exposure across the surface of the material substrate. In some embodiments, Gamma radiation chamber 106 provides an exposure with a dosage gradient at various percentages. For example, an exposure with a dosage gradient that is less than 5% from the center of the material substrate to the edge can be provided. The total accumulated dosage level of Gamma radiation may be optimized (by the control system 214) based on the material property information in order to achieve an optimum balance between the cure state (net cross-linking), degree of fragmentation and residual stress relaxation. In some embodiments, the total accumulated dosage level may be less than 50 mega radians (Mrad). Gamma rays may have a higher energy content than UV rays and also have a higher penetration depth. In addition, a line of sight between the radiation source and the material substrate is not required to activate the curing process. Thus, as exposure to Gamma radiation continues, excess photo initiators that were not activated by the UV radiation exposure may be activated, resulting in further cross-linking of the monomers within the material substrate. In this way, the material substrate may reach a high cure state while relieving the residual stress that is not reachable with exposure to UV radiation alone. As a result of reaching a high cure state, the hygrothermal stability of the material substrate may be maximized without adversely affecting the initial dimension of the resin layer. FIG. 2B shows the material substrate 112 of FIG. 1, after exposure to Gamma radiation 208. As can be seen, all of the monomers within the material substrate, including monomers 204 and 206 are fully cross linked, indicating that the material substrate has become solid and has undergone an increase in density.

In some embodiments, curing assembly 102 may further include a thermal exposure chamber 110. Based on the material property information and/or a current cure state of material substrate 112 as reported by cure state monitor 108, control system 214 may determine that thermal exposure is also required in order to induce annealing or to achieve a thermodynamically stable dimension and surface flatness. Control system 214 may determine a thermal exposure temperature and time of exposure based on the material property information and the current cure state of the material substrate as reported by cure state monitor 108. More specifically, processor 232 may execute one or more instructions stored in memory 230 in order to generate one or more control parameters corresponding to the thermal exposure temperature and exposure time based on the material property information and the current cure state information received from the cure state monitor 108, and transmit the one or more control parameters to the curing assembly 102.

The thermal exposure chamber 110 may expose material substrate 112 to heat based on the one or more control parameters corresponding to the thermal exposure temperature and exposure time.

In some embodiments, material substrate 112 may replicate the surface of the first substrate layer while bonding to the second substrate layer during the curing process. Curing assembly 102 may remove the material substrate 112 from the first substrate layer and coat material substrate 112 with a reflective metal, thereby producing a composite mirror with high dimensional stability.

Figure 3:
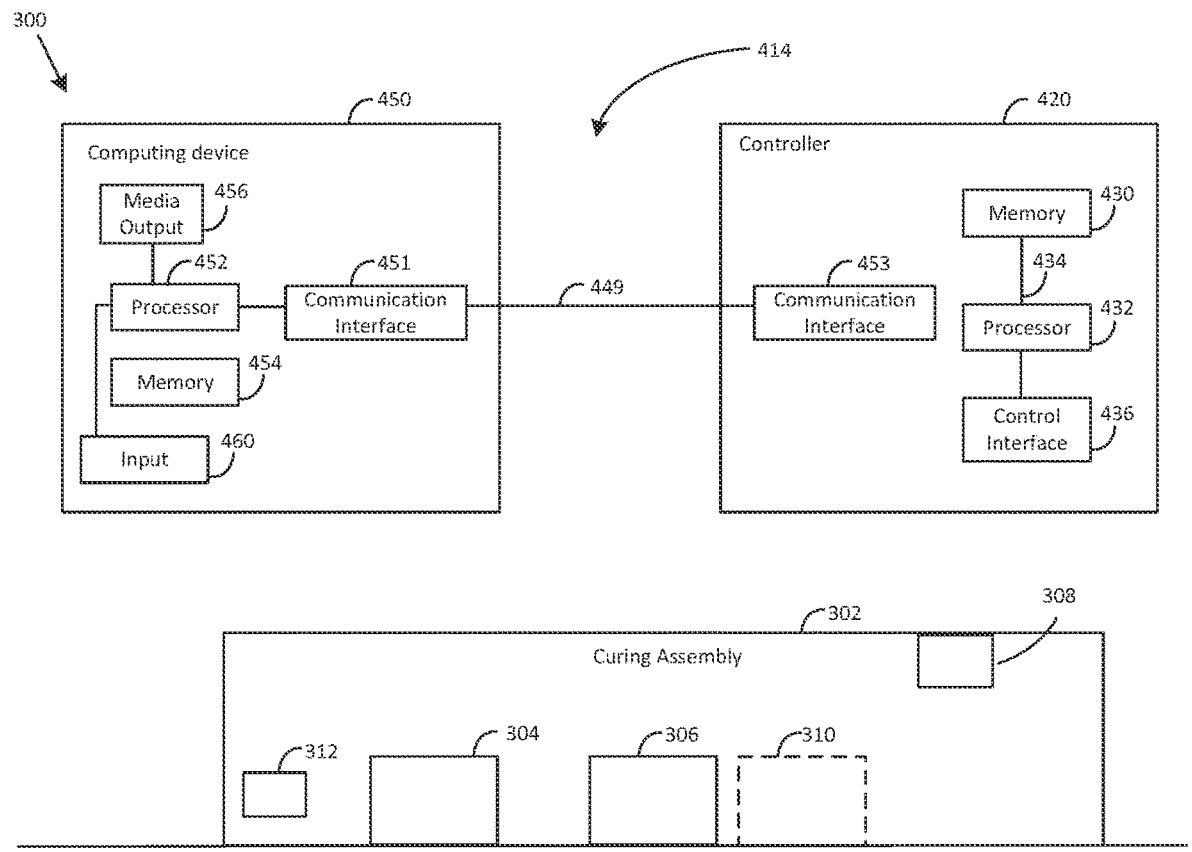
FIG. 3 is a block diagram of an exemplary system in accordance with some embodiments of the present disclosure.

FIG. 3 illustrates an exemplary system 300 for curing a material substrate 312. System 300 may include a curing assembly 302 and a control system 414. Control system 414 may be similar to control system 214 described with respect to FIG. 1. Curing assembly 302 may include a mixing apparatus 304, a Gamma radiation exposure chamber 306, and a cure state monitor 308. Gamma radiation exposure chamber 306 may be a non-oxidizing environment. For example, Gamma radiation chamber 306 comprises a nitrogen heavy environment. Mixing apparatus 304 may receive material substrate 312, and mix material substrate 312 with nano-filler particles in order to augment material substrate 112. In some embodiments, the nano-filler particles may be graphite nano-platelet (GnP) filler particles. Mixing apparatus 304 may be configured to operate at thousands of revolutions per minute in order to ensure a uniform mixture of nano-filler particles in the material substrate 312. The addition of nano-filler particles to material substrate 112 may result in a replicated structure having further reduced coefficient of thermal expansion (CTE), further reduced moisture absorption, and certain types of functionality such as thermal and/or electrical conductivity. Due to the small penetration depth of UV rays however, nano-fillers may block UV rays, thus preventing successful curing of a material substrate containing nano-fillers. However, as discussed above, Gamma rays have a deeper penetration depth and a higher energy. In some embodiments, material substrate 312 may be integrated within a composite article (not shown) having a first substrate layer and a second substrate layer. For example, material substrate 312 is sandwiched between the first substrate layer and the second substrate layer of the composite article. In some embodiments, the first substrate layer may be a mandrel and the second substrate layer may be a composite substrate.

Control system 414 may receive material property information pertaining to the chemistry of the material substrate 312 from a user via input interface 460. For example, a user may indicate the chemical composition (including nano-filler particles) and chemical ratios, among other information. Based on the information received from input interface 460, control system 414 may determine a Gamma radiation dosage level and exposure time. More specifically, processor 432 may execute one or more instructions stored in memory 430 in order to generate one or more control parameters corresponding to the Gamma radiation dosage level and exposure time based on the material property information received from the user, and transmit the one or more control parameters to the curing assembly 302.

In some embodiments, control system 414 may utilize cure state monitor 308 to determine the material property information of material substrate 312. Cure state monitor 308 may be any suitable type of cure state monitor including, by way of example only, an optical fiber cure state monitor, which may also be configured to characterize a material substrate using spectroscopy, a dielectric sensor based cure state monitor, an ultrasonic cure state monitor, or a thermal cure state monitor. Upon determining the material property information of the material substrate, cure state monitor 308 may provide this information to control system 414 via the control interface 436. Based on the information received from cure state monitor 308, control system 414 may determine a Gamma radiation dosage level and exposure time. More specifically, processor 432 may execute one or more instructions stored in memory 230 in order to generate one or more control parameters corresponding to the Gamma radiation dosage level and exposure time based on the material property information received from the cure state monitor 308, and transmit the one or more control parameters to the curing assembly 302.

In some embodiments, Gamma radiation chamber 306 may expose the material substrate 312 to Gamma radiation. The dosage level and time of the Gamma radiation exposure may be based, at least in part, on the one or more control parameters received from the control system 414. Gamma radiation chamber 306 may provide a uniform exposure across the surface of the material substrate. For example, Gamma radiation chamber 306 provides an exposure with a dosage gradient that is less than 5% from the center of the material substrate to the edge. As discussed above, the total accumulated dosage level of Gamma radiation may be optimized based on the material property information. In some embodiments, the total accumulated dosage level may be less than 50 mega radians (Mrad). As discussed above, Gamma rays may have a higher energy content than UV rays and also have a high penetration depth. In addition, a line of sight between the radiation source and the material substrate is not required to activate the curing process. As exposure to Gamma radiation continues, photo initiators within material substrate 312 may be activated, resulting in cross-linking of the monomers within material substrate 312. However, due to the higher energy content and high penetration depth of Gamma rays, substantially all the photo-initiators within material substrate 312 may be activated, resulting in the monomers within material substrate 312 being fully cross-linked. As discussed above, FIG. 2B shows a material substrate after exposure to Gamma radiation such that the monomers are fully cross-linked, resulting in the material substrate becoming solid and undergoing an increase in density. In this way, the material substrate may reach a high cure state that is not reachable with exposure to UV radiation alone. As a result of reaching a high cure state, the hygro-thermal stability of the material substrate may be maximized.

In some embodiments, curing assembly 302 may further include a thermal exposure chamber 310. Based on the material property information and/or the current cure state of material substrate 312, control system 414 may determine that thermal exposure is also required in order to induce annealing or to achieve a thermodynamically stable dimension and surface flatness. Control system 414 may determine a thermal exposure temperature and time of exposure based on the material property information and the current cure state of the material substrate as reported by cure state monitor 308. More specifically, processor 432 may execute one or more instructions stored in memory 430 in order to generate one or more control parameters corresponding to the thermal exposure temperature and exposure time based on the material property information and the current cure state information received from the cure state monitor 308, and transmit the one or more control parameters to the curing assembly 302.

The thermal exposure chamber 310 may expose material substrate 312 to heat based on the one or more control parameters corresponding to the thermal exposure temperature and exposure time. In some embodiments, thermal exposure chamber 310 may expose the material substrate 312 to hear in a cyclic manner.

In some embodiments, material substrate 312 may replicate the surface of the first substrate layer while bonding to the second substrate layer during the curing process. Curing assembly 302 may remove the material substrate 312 from the first substrate layer and coat material substrate 312 with a reflective metal, thereby producing a composite mirror with high dimensional stability.

Figure 4:
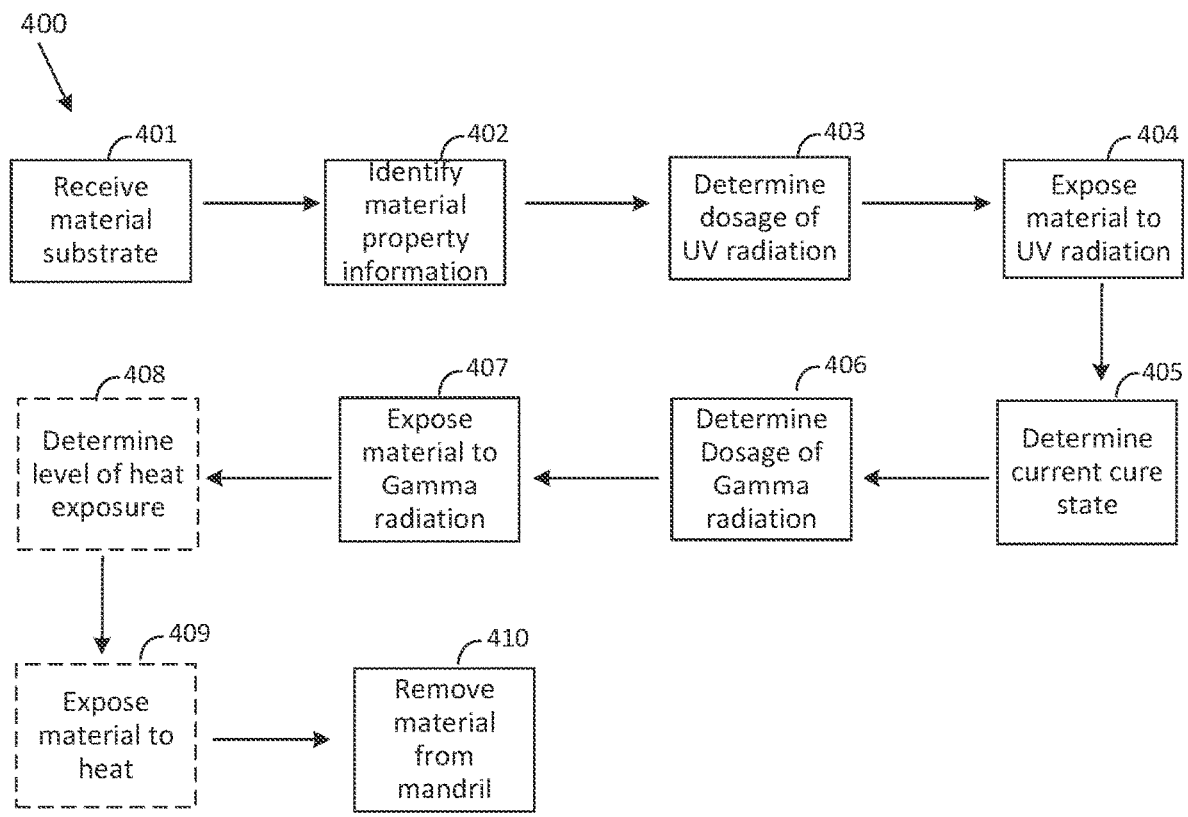
FIG. 4 is a flow diagram of an exemplary method in accordance with some embodiments of the present disclosure.

FIG. 4 illustrates a method 400, in accordance with embodiments of the present disclosure. The method 400 may be performed by a material curing system, such as system 100 illustrated in FIG. 1, for example.

At step 401, a material substrate 112 is received at the curing assembly 102. In some embodiments, material substrate 112 may be incorporated into a composite article (not shown) having a first substrate layer and a second substrate layer. For example, material substrate 112 is sandwiched between the first substrate layer and the second substrate layer of the composite article. In some embodiments, the first substrate layer may be a mandrel and the second substrate layer may be a composite substrate. At step 402, the material property information of a material substrate, such as material substrate 112 of FIG. 1 may be determined.

Control system 214 may receive material property information pertaining to the chemical composition and chemical ratios of material substrate 112 from a user via user input 260. A user may indicate the chemical properties of material substrate 112 via the user input 260 and computing device 250 may transmit the material property information to the controller 220 via communication interface 251.

In some embodiments, control system 214 may utilize cure state monitor 108 to determine the material property information of the material substrate. Cure state monitor 108 may be any suitable type of cure state monitor including, by way of example only, an optical fiber cure state monitor, which may also be configured to characterize the chemical composition of material substrate 112 using spectroscopy, a dielectric sensor based cure state monitor, an ultrasonic cure state monitor, or a thermal cure state monitor. Upon determining the chemical composition and chemical ratios of the material substrate, cure state monitor 108 may provide this information to control system 214 via the control interface 236.

At step 403, based on the material property information, control system 214 may determine (via controller 220) a UV radiation dosage level and exposure time. More specifically, processor 232 may execute one or more instructions stored in memory 230 in order to generate one or more control parameters corresponding to the UV radiation dosage level and exposure time based on the material property information received, and transmit the one or more control parameters to the curing assembly 102 via the control interface 236.

At step 404, UV radiation exposure chamber 104 may expose the material substrate to UV radiation. The dosage level and time of the exposure may be based, at least in part, on the one or more control parameters received from the control system 214. As exposure to UV radiation continues, the cure state of the material substrate may begin increasing. More specifically, monomers within the material substrate may begin cross-linking, which facilitates the process by which the material substrate may transition from a liquid to a solid, while increasing in density (curing process). The exposure to UV radiation may activate photo-initiator particles within the material substrate, which promotes cross linking of the monomers. However, the penetration depth of UV rays is small, and a line of sight between the rays and the monomers is required. Therefore, the amount of cross-linking that may occur as a result of exposure to UV radiation is limited due to the inability of UV radiation to activate all photo-initiator particles. FIG. 2A shows the material substrate 112 of FIG. 1, after exposure to UV radiation 202. As can be seen, material substrate 112 is only partially cross-linked, with monomers 204 being cross linked, while monomers 206 are as of yet not cross-linked.

Referring back to FIG. 4, cure state monitor 108 may continuously monitor the cure state of material substrate 112 during UV radiation exposure and may provide updates on the cure state of material substrate 112 to control system 214 at regular intervals. At step 405, in some embodiments, cure state monitor 108 may determine the post-UV exposure cure state of material substrate 112. At step 406, control system 214 may determine a Gamma radiation dosage level and time of exposure based on the material property information and the post-UV exposure cure state of material substrate 112 as reported by cure state monitor 108. More specifically, processor 232 may execute one or more instructions stored in memory 230 in order to generate one or more control parameters corresponding to the Gamma radiation dosage level and exposure time based on the material property information and the post-UV exposure cure state received from the cure state monitor 108, and transmit the one or more control parameters to the curing assembly 102.

At step 407, Gamma radiation chamber 106 may expose the material substrate 112 to Gamma radiation. As with the UV radiation exposure, the dosage level and time of the Gamma radiation exposure may be based, at least in part, on the one or more control parameters corresponding to the Gamma radiation dosage level and exposure time received from the control system 214. Gamma radiation chamber 106 may provide a uniform exposure across the surface of the material substrate. In some embodiments, Gamma radiation chamber 106 provides an exposure with a dosage gradient at various percentages. For example, Gamma radiation chamber 106 provides an exposure with a dosage gradient that is less than 5% from the center of the material substrate to the edge. As discussed above, the total accumulated dosage level of Gamma radiation may be optimized based on the material property information. Gamma rays may have a higher energy content than UV rays and also have a higher penetration depth. In addition, a line of sight between the radiation source and the material substrate is not required to activate the curing process. Thus, as exposure to Gamma radiation continues, excess photo initiators that were not activated by the UV radiation exposure may be activated, resulting in further cross-linking of the monomers within the material substrate. In this way, the material substrate may reach a high cure state while relieving residual stress from the initial cure that is not reachable with exposure to UV radiation alone. As a result of reaching a high cure state, the hygrothermal stability of the material substrate may be maximized, among other benefits described herein. FIG. 2B shows the material substrate 112 of FIG. 1, after exposure to Gamma radiation 208. As can be seen, all of the monomers within the material substrate, including monomers 204 and 206 are fully cross linked, indicating that the material substrate has become solid and undergone an increase in density.

In some embodiments, based on the material property information and/or the current cure state of material substrate 112, control system 214 may determine that thermal exposure is also required in order to achieve a high cure state. Thus, at step 408, control system 214 may determine a thermal exposure temperature and time of exposure based on the material property information and the current cure state of the material substrate 112 as reported by cure state monitor 108. More specifically, processor 232 may execute one or more instructions stored in memory 230 in order to generate one or more control parameters corresponding to the thermal exposure temperature and exposure time based on the material property information and the current cure state information received from the cure state monitor 108, and transmit the one or more control parameters to the curing assembly 102.

At step 409, thermal exposure chamber 110 may expose material substrate 112 to heat based on the one or more control parameters corresponding to the thermal exposure temperature and exposure time.

In some embodiments, material substrate 112 may replicate the surface of the first substrate layer while bonding to the second substrate layer during the curing process. At step 410, curing assembly 102 may remove the material substrate 112 from the first substrate layer and coat material substrate 112 with a reflective metal, thereby producing a composite mirror with high dimensional stability.

Figure 5:
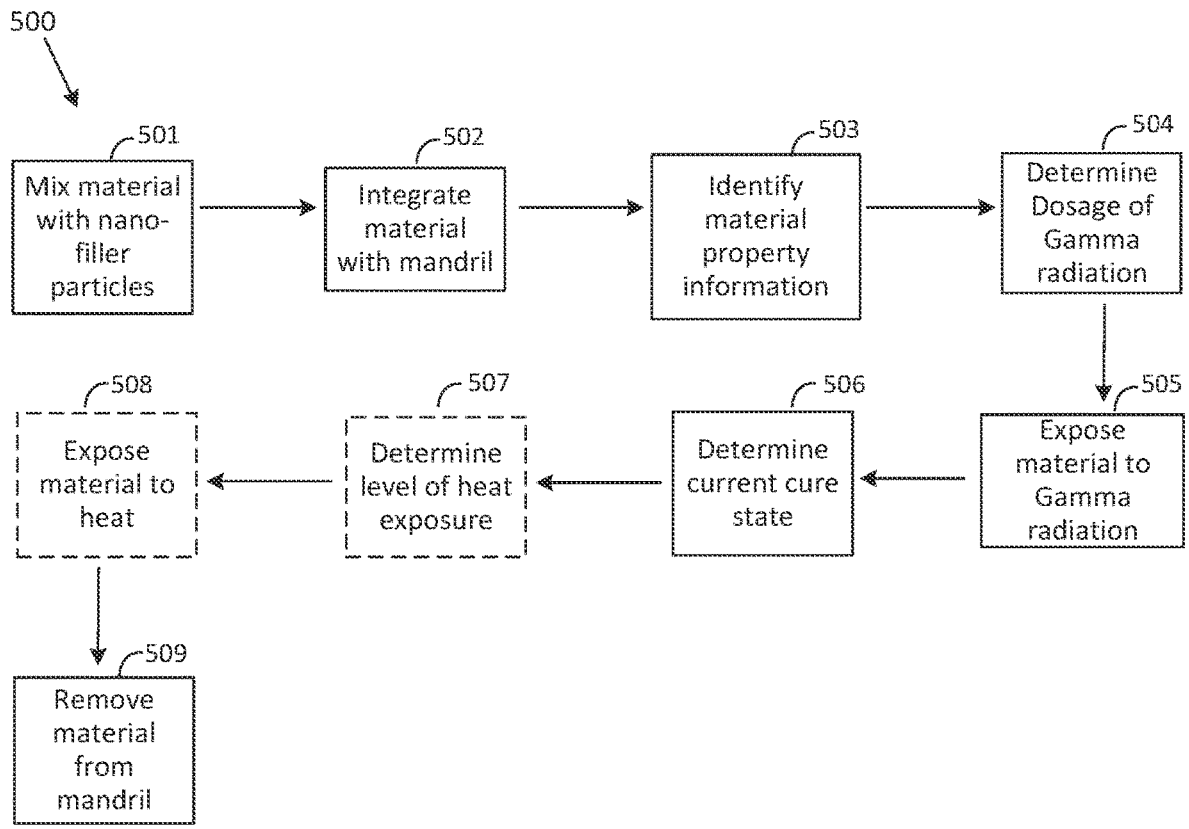
FIG. 5 is a flow diagram of an exemplary method in accordance with some embodiments of the present disclosure.

FIG. 5 illustrates a method 500 in accordance with some embodiments of the present disclosure. The method 500 may be performed by a material curing system, such as system 300 of FIG. 3.

At step 501, curing assembly 302 may receive material substrate 312, and mixing apparatus 304 may mix material substrate 312 with nano-filler particles (not shown) in order to augment material substrate 312. In some embodiments, the nano-filler particles may be graphite nano-platelet (GnP) filler particles. Mixing apparatus 304 may be configured to operate at thousands of revolutions per minute in order to ensure a uniform mixture of nano-filler particles in the material substrate 312. The addition of nano-filler particles to material substrate 312 may result in a replicated structure having further reduced CTE, further reduced moisture absorption, and certain types of functionality such as thermal and/or electrical conductivity. Due to the small penetration depth of UV rays however, nano-fillers may block UV rays, thus preventing successful curing of a material substrate containing nano-fillers. However, as discussed above, Gamma rays may have a deeper penetration depth and a higher energy.

At step 502, in some embodiments, material substrate 312 may be integrated within a composite article (not shown) having a first substrate layer and a second substrate layer. For example, material substrate 312 is sandwiched between the first substrate layer and the second substrate layer of the composite article. In some embodiments, the first substrate layer may be a mandrel and the second substrate layer may be a composite substrate.

At step 503, control system 414 may determine the material property information of material substrate 312. In some embodiments, control system 414 may receive material property information pertaining to the chemistry of the material substrate 312 from a user via input interface 460. For example, a user may indicate the chemical composition (including nano-filler particles) and chemical ratios, as well as information regarding required cure state, residual stress, and surface flatness among others. Based on the information received from input interface 460, control system 414 may determine a Gamma radiation dosage level and exposure time. More specifically, processor 432 may execute one or more instructions stored in memory 430 in order to generate one or more control parameters corresponding to the Gamma radiation dosage level and exposure time based on the material property information received from the user, and transmit the one or more control parameters to the curing assembly 302.

In some embodiments, control system 414 may utilize cure state monitor 308 to determine the material property information of material substrate 312. Cure state monitor 308 may be any suitable type of cure state monitor including, by way of example only, an optical fiber cure state monitor, which may also be configured to characterize a material substrate using spectroscopy, a dielectric sensor based cure state monitor, an ultrasonic cure state monitor, or a thermal cure state monitor. Upon determining the material property information of the material substrate, cure state monitor 308 may provide this information to control system 414 via the control interface 436.

At step 504, based on the information received from input interface 460, control system 414 may determine a Gamma radiation dosage level and exposure time. More specifically, processor 432 may execute one or more instructions stored in memory 430 in order to generate one or more control parameters corresponding to the Gamma radiation dosage level and exposure time based on the material property information received from cure state monitor 308 (or the user), and transmit the one or more control parameters to the curing assembly 302.

At step 505, in some embodiments, Gamma radiation chamber 306 may expose the material substrate 312 to Gamma radiation. The dosage level and time of the Gamma radiation exposure may be based, at least in part, on the one or more control parameters received from the control system 414. Gamma radiation chamber 306 may provide a uniform exposure across the surface of the material substrate. For example, Gamma radiation chamber 306 provides an exposure with a dosage gradient that is less than 5% from the center of the material substrate to the edge. As discussed above, the total accumulated dosage level of Gamma radiation may be optimized based on the material property information. In some embodiments, the total accumulated dosage level may be less than 50 mega radians (Mrad). As discussed above, Gamma rays may have a higher energy content than UV rays and also have a high penetration depth. In addition, a line of sight between the radiation source and the material substrate is not required to activate the curing process. As exposure to Gamma radiation continues, photo initiators within material substrate 312 may be activated, resulting in cross-linking of the monomers within material substrate 312. However, due to the higher energy content and high penetration depth of Gamma rays, substantially all the photo-initiators within material substrate 312 may be activated, resulting in the monomers within material substrate 312 being fully cross-linked. As discussed above, FIG. 2B shows a material substrate after exposure to Gamma radiation such that the monomers are fully cross-linked, resulting in the material substrate becoming solid and undergoing an increase in density. In this way, the material substrate may reach a high cure state that is not reachable with exposure to UV radiation alone. As a result of reaching a high cure state, the hygrothermal stability of the material substrate may be maximized.

Referring back to FIG. 5, cure state monitor 308 may continuously monitor the cure state of material substrate 312 during UV radiation exposure and may provide updates on the cure state of material substrate 312 to control system 414 at regular intervals. At step 506, cure state monitor 308 may determine a current cure state of material substrate 312. Based on the material property information and/or the current cure state of material substrate 312, control system 414 may determine that thermal exposure is also required in order to induce annealing or to achieve a thermodynamically stable dimension and surface flatness. Thus, at step 507, control system 414 may determine a thermal exposure temperature and time of exposure based on the material property information and the current cure state of the material substrate as reported by cure state monitor 308. More specifically, processor 432 may execute one or more instructions stored in memory 430 in order to generate one or more control parameters corresponding to the thermal exposure temperature and exposure time based on the material property information and the current cure state information received from the cure state monitor 308, and transmit the one or more control parameters to the curing assembly 302.

At step 508, thermal exposure chamber 310 may expose material substrate 312 to heat based on the one or more control parameters corresponding to the thermal exposure temperature and exposure time.

In some embodiments, material substrate 312 may replicate the surface of the first substrate layer while bonding to the second substrate layer during the curing process. At step 509, curing assembly 302 may remove the material substrate 312 from the first substrate layer and coat material substrate 312 with a reflective metal, thereby producing a composite mirror with high dimensional stability.

Figure 6:
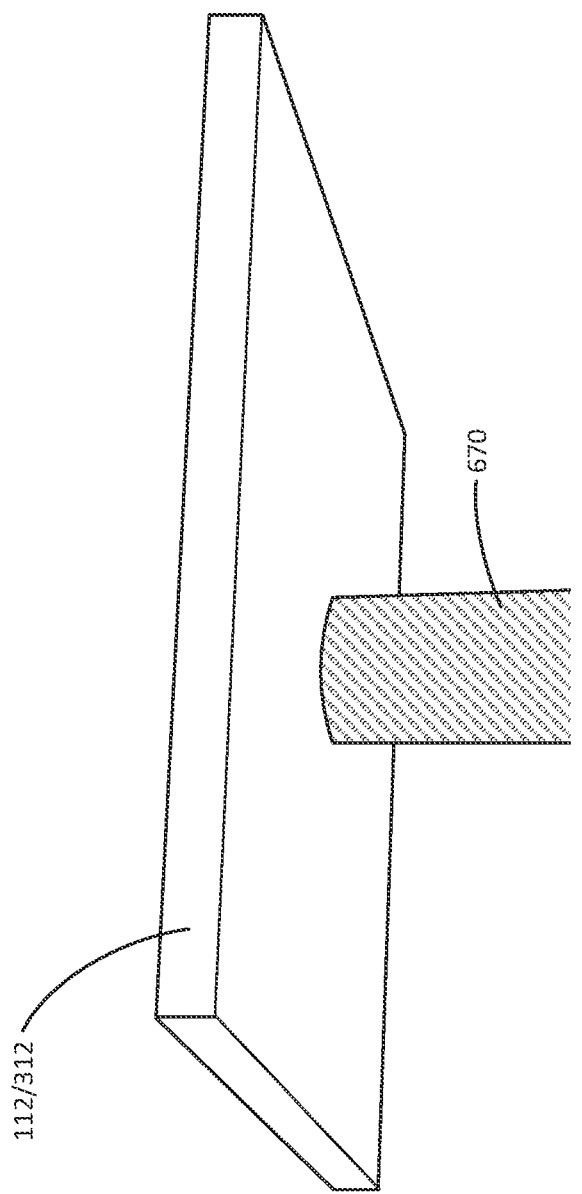
FIG. 6 is a perspective view of an exemplary structure attached to a support structure in accordance with some embodiments of the present disclosure.
Figure 7:
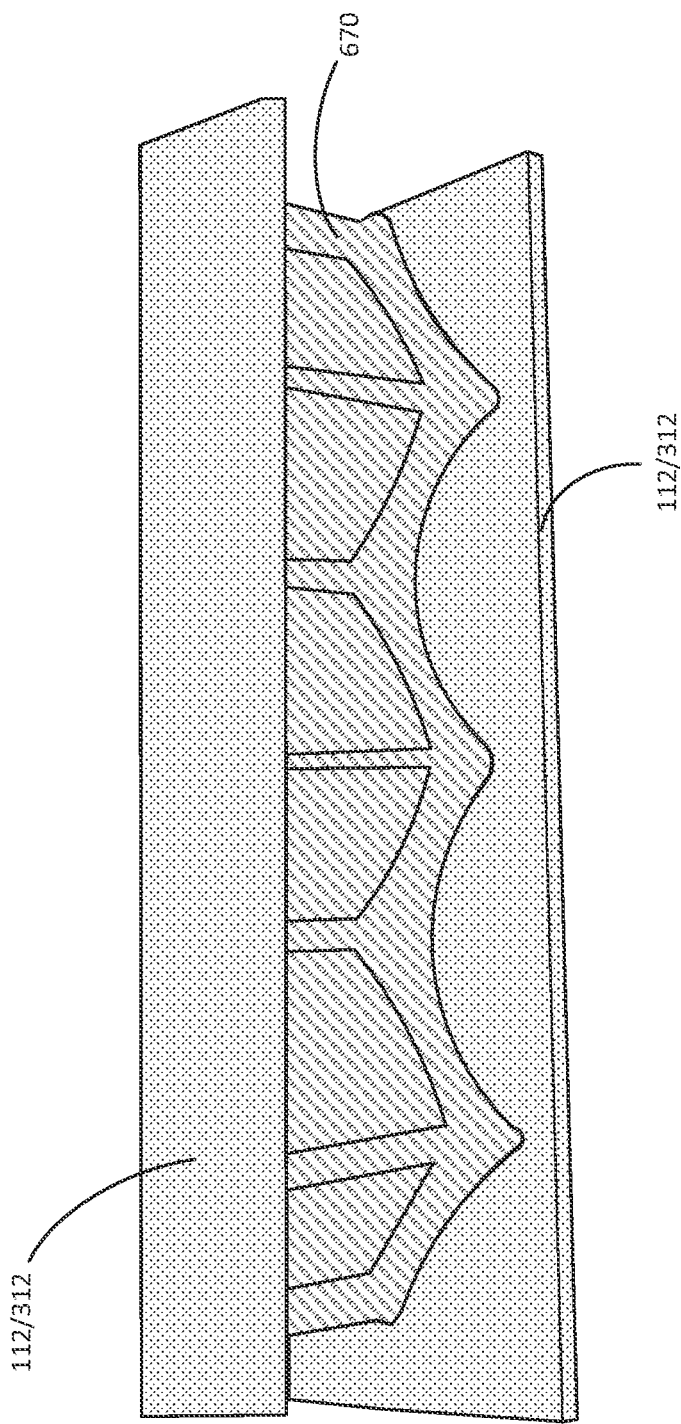
FIG. 7 is a perspective view of exemplary structures attached to a support structure in accordance with some embodiments of the present disclosure.

FIG. 6 illustrates an exemplary structure, material substrate 112 or 312, attached to a support structure 670. FIG. 7 illustrates exemplary structures, material substrates 112 or 312, attached to a support structure 670. Such a support structure 670, bonded with an adhesive to material substrate(s) 112 or 312, can be used in optical alignments, and its dimensional stability would be improved by the radiation treatment, described with respect to FIGS. 8 & 9. Individual components would be adhesively bonded and cured to form the bonded structure (e.g., material substrate 112 or 312) and support structure 670 (as shown in FIGS. 6 & 7), which would then be exposed to the radiation treatment to stabilize the bonded interface.

In some embodiments, an assembly (e.g., curing assembly 102 or 302) may comprise an exposure chamber (e.g., Gamma radiation exposure chamber 106 or 306). The exposure chamber may be configured to receive a structure (e.g., material substrate 112 or 312) and identify at least one portion of the structure for further processing. The exposure chamber (e.g., Gamma radiation exposure chamber 106 or 306) may be further configured to expose the at least one portion of the structure to radiation such that a high cure state and a low residual stress are achieved for the adhesive material and, therefore, the bonded structure and support structure 670. The dosage level of the radiation may be determined based, at least in part, on the composition of the structure (e.g., the composition of material substrate 112 or 312). In some embodiments, the structure (e.g., material substrate 112 or 312) may be an optical substrate. In some embodiments the optical substrate may be formed of, but is not limited to, a glass or composite material.

The assembly may be further configured to receive a support structure 670 (illustrated in FIGS. 6 and 7) configured to attach to the structure (e.g., material substrate 112 or 312), as illustrated in FIGS. 6 and 7. The support structure 670 may be formed of, but is not limited to, a metal, glass, or composite material. For example, FIG. 6 illustrates a metal support structure 670 attached to a glass material substrate 112 or 312, and FIG. 7 illustrates a metal support structure 670 attached to two composite material substrates 112 or 312. The support structure 670 may be adhesively attached to the structure (e.g., material substrate 112 or 312) before the structure enters an exposure chamber.

The assembly (e.g., curing assembly 102 or 302) may further comprise an additional exposure chamber (e.g., UV radiation exposure chamber 104, thermal exposure chamber 110 or 310) adjacent to the exposure chamber (e.g. Gamma radiation exposure chamber 106 or 306). In some embodiments, the additional exposure chamber (e.g., UV radiation exposure chamber 104) may be configured to expose at least one portion of the structure (e.g., a portion of material substrate 112) to UV light such that at least a partial cure state is achieved for the structure prior to exposure in the exposure chamber (e.g., Gamma radiation exposure chamber 106). The dosage level of the UV light may be based, at least in part, on the composition of the structure (e.g., the composition of material substrate 112). In some embodiments, the additional exposure chamber (e.g., thermal exposure chamber 110 or 310) may be configured to expose the structure (e.g., material substrate 112 or 312) to heat. The level of heat exposure may be based, at least in part, on the composition of the structure (e.g., the composition of material substrate 112 or 312).

The assembly (e.g., curing assembly 302) may further comprise a mixing apparatus (e.g., mixing apparatus 304) configured to mix an adhesive material (to be applied to the structure (e.g., material substrate 312)) with a plurality of nano-filler particles prior to the structure's exposure in the exposure chamber (e.g., Gamma radiation exposure chamber 306).

The assembly described above may be included in systems 100 or 300 as curing assembly 102 or 302, respectively.

Figure 8:
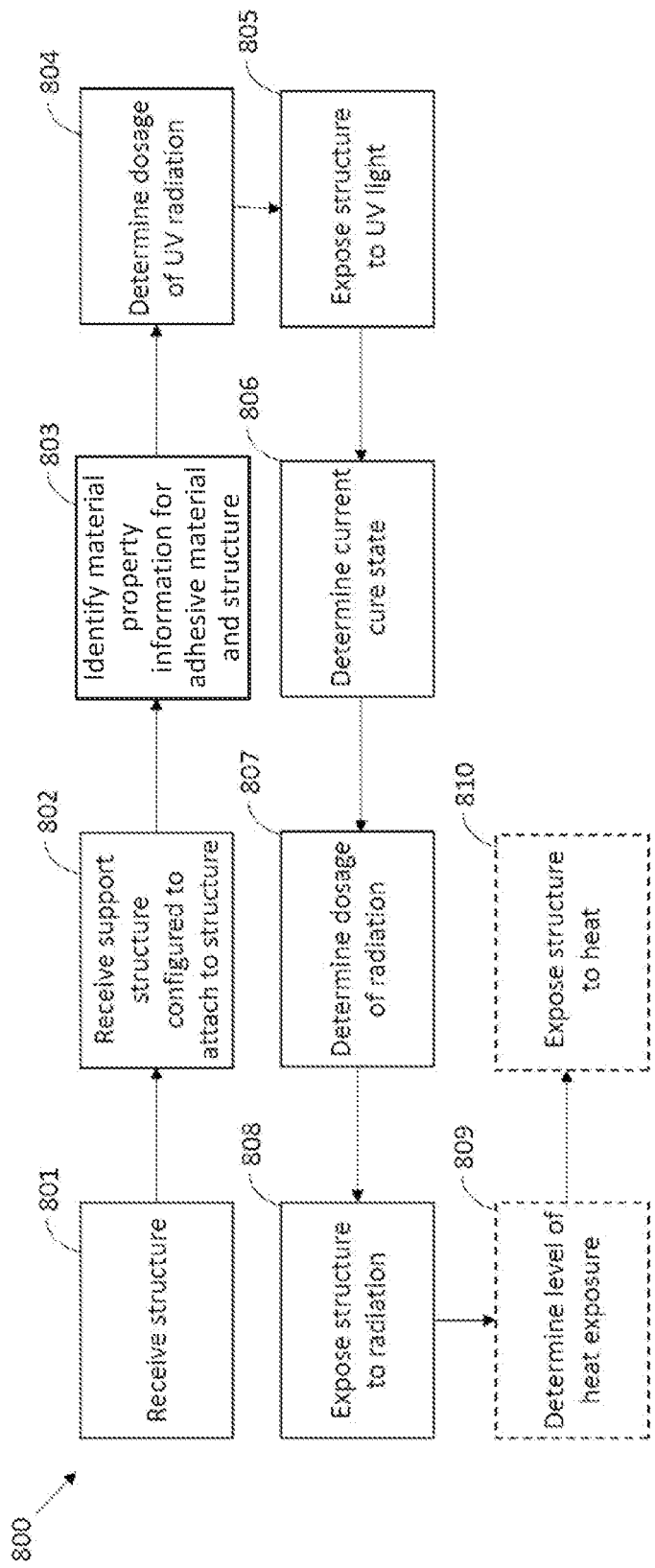
FIG. 8 is a flow diagram of an exemplary method in accordance with some embodiments of the present disclosure.

FIG. 8 illustrates a method 800, in accordance with embodiments of the present disclosure. The method 800 may be performed by a material curing system, such as system 100 illustrated in FIG. 1, for example.

At step 801, a structure (e.g., material substrate 112) is received at the curing assembly 102. In some embodiments, the structure (e.g., material substrate 112) may be an optical substrate that may be formed of, but is not limited to, a glass or composite material. At step 802, a support structure 670 configured to attach to the structure is received at the curing assembly 102. The support structure 670 and the structure may be attached to each other by an adhesive material. In some embodiments, the support structure 670 may be formed of a metal, glass, or composite material. At step 803, the material property information of the adhesive material and the structure (e.g., material substrate 112) may be identified in a manner similar to the one described above with respect to FIG. 4.

At step 804, based on the material property information, control system 214 may determine (via controller 220) a UV radiation dosage level and exposure time in a manner similar to the one described above with respect to FIG. 4.

At step 805, an exposure chamber (e.g., UV radiation exposure chamber 104) may expose at least one portion of the structure (e.g., material substrate 112) to UV light such that at least a partial cure state is achieved for the structure prior to exposing the at least one portion of the structure to radiation such that a high cure state and a low residual stress are achieved for the adhesive material and, therefore the bonded structure and support structure 670. In some embodiments, an exposure chamber (e.g., UV radiation exposure chamber 104) may expose the at least one portion of the structure (e.g., material substrate 112) and the support structure 670 to UV light. The dosage level of the UV light may be based, at least in part, on the composition of the structure (e.g., the composition of material substrate 112). Upon initial exposure to UV light at step 805, the support structure 670 and the material substrate 112 become bonded. Until then they must be held together externally. Once the adhesive material is cured by the initial UV exposure, the support structure 670 and material substrate 112 should hold their final form on their own, held together by the cured adhesive material.

Cure state monitor 108 may continuously monitor the cure state of the structure (e.g., material substrate 112) and the adhesive material during UV radiation exposure and may provide updates on the cure state of the structure and the adhesive material to control system 214 at regular intervals. At step 806, in some embodiments, cure state monitor 108 may determine the post-UV exposure cure state of the structure (e.g., material substrate 112) and the adhesive material. At step 807, control system 214 may determine a radiation (e.g., Gamma radiation) dosage level and time of exposure based on the material property information and the post-UV exposure cure state of the structure (e.g., material substrate 112) and the adhesive material as reported by the cure state monitor 108.

At step 808, an exposure chamber (e.g. Gamma radiation chamber 106) may expose at least one portion of the structure (e.g., material substrate 112) to radiation (e.g., Gamma radiation) such that a high cure state and a low residual stress are achieved for the adhesive material and, therefore the bonded structure and support structure. The dosage level of the radiation is determined based, at least in part, on the composition of the structure (e.g., material substrate 112).

In some embodiments, based on the material property information and/or the current cure state of the structure and the adhesive material, control system 214 may determine that thermal exposure is also required in order to achieve a high cure state. Thus, at step 809, control system 214 may determine the thermal exposure temperature and time of exposure based on the material property information and the current cure state of the structure (e.g., material substrate 112) and the adhesive material as reported by cure state monitor 108.

At step 810, an exposure chamber (e.g., thermal exposure chamber 110) may expose the structure (e.g., material substrate 112) to heat. The level of heat exposure may be based, at least in part, on the composition of the structure (e.g., material substrate 112).

Figure 9:
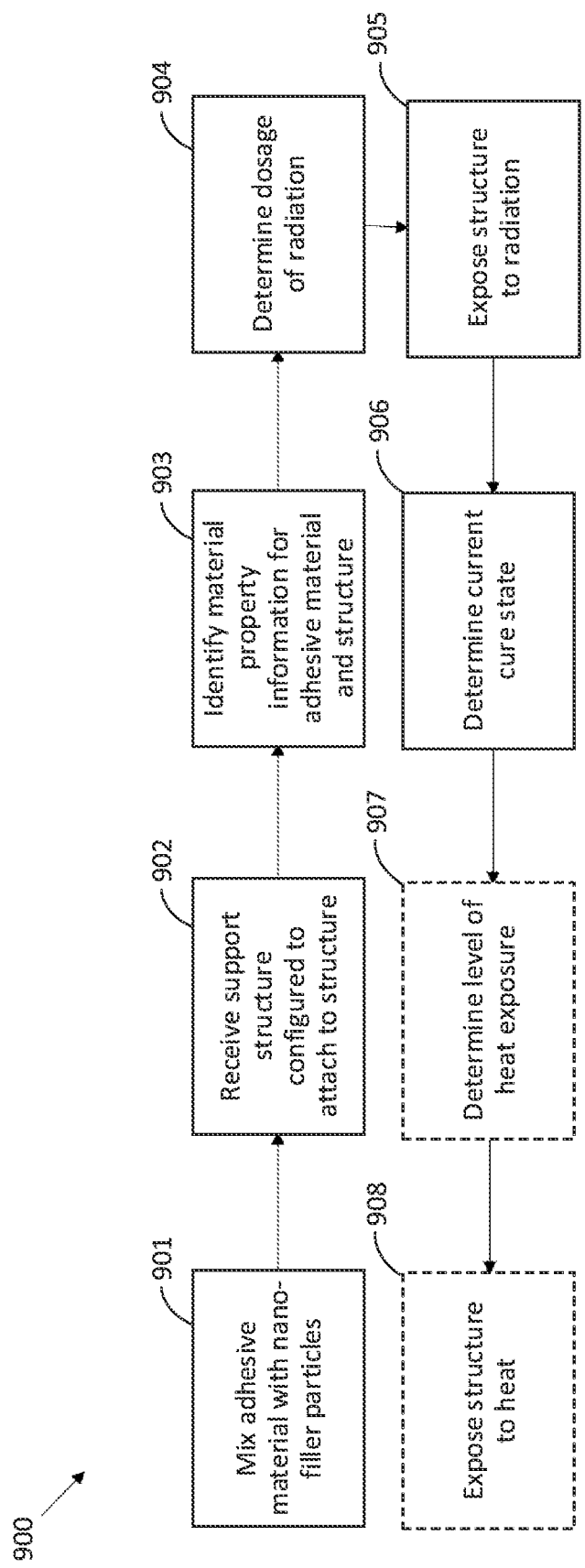
FIG. 9 is a flow diagram of an exemplary method in accordance with some embodiments of the present disclosure.

FIG. 9 illustrates a method 900 in accordance with some embodiments of the present disclosure. The method 900 may be performed by a material curing system, such as system 300 of FIG. 3.

At step 901, curing assembly 302 may receive a structure (e.g., material substrate 312), and mixing apparatus 304 may mix an adhesive material (to be applied to the structure) with a plurality of nano-filler particles in order to augment the structure once the adhesive material is applied to it, prior to exposing at least one portion of the structure to radiation such that a high cure state is achieved for the structure. Nano-filler particles would be mixed into the adhesive material that is used to bond the structure and the support structure 670 together. The nano-filler particles are typically used to improve various properties (e.g., thermal, mechanical, electrical properties) of the adhesive material, but high concentrations are difficult to implement for UV curable adhesives because UV light cannot penetrate through the nano-filler particles. Gamma radiation, however, can penetrate through the nano-filler particles even at high filler concentrations.

At step 902, curing assembly 302 may receive a support structure 670 configured to attach to the structure. The support structure 670 and the structure (e.g., material substrate 312) may be attached to each other by the adhesive material. The attachment is done by the initial curing of the adhesive material via UV irradiation or temperature exposure.

At step 903, control system 414 may identify material property information for the adhesive material and the structure (e.g., material substrate 312) in a manner similar to the one described above with respect to FIG. 5.

At step 904, control system 414 may determine a dosage of radiation (e.g., Gamma radiation dosage level and exposure time) in a manner similar to the one described above with respect to FIG. 5.

At step 905, an exposure chamber (e.g., Gamma radiation exposure chamber 306) may expose at least one portion of the structure (e.g., a portion of material substrate 312) to radiation (e.g., Gamma radiation) such that a high cure state and low residual stress are achieved for the adhesive material and, therefore, the bonded structure and support structure 670. The dosage level of the radiation is determined based, at least in part, on the composition of the structure.

At step 906, cure state monitor 308 may determine a current cure state of the adhesive material and, therefore, the bonded structure (e.g., material substrate 312) and support structure 670 in a manner similar to the one described above with respect to FIG. 5. Based on the material property information and/or the current cure state of the adhesive material and the bonded structure (e.g., material substrate 312) and support structure 670, control system 414 may determine that thermal exposure is also required in order to induce annealing or to achieve thermodynamically stable dimension and surface flatness. Thus, at step 907, control system 414 may determine a thermal exposure temperature and time of exposure based on the material property information and the current cure state of the adhesive material and the bonded structure (e.g., material substrate 312) and support structure 670 as reported by cure state monitor 308.

At step 908, an exposure chamber (e.g., thermal exposure chamber 310) may expose the structure (e.g., material substrate 312) to heat. The level of heat exposure is based, at least in part, on the composition of the structure (e.g., composition of material substrate 312).

The embodiments described herein may be applied to the manufacture of lightweight replicated optics on various substrates including carbon fiber reinforced composite, glass, and aluminum, among others. The embodiments described herein may also be applied to adhesive bonded optical support structures where nanometer-scale stability may be required.

Exemplary embodiments of the systems and methods are described above in detail. The systems and methods are not limited to the specific embodiments described herein, but rather, components of the systems and/or steps of the method may be utilized independently and separately from other components and/or steps described herein. For example, the system may also be used in combination with other systems and methods, and is not limited to practice with only a system as described herein. Rather, the exemplary embodiment can be implemented and utilized in connection with many other systems.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An assembly comprising:
   an exposure chamber configured to receive a structure and expose at least one portion of the structure to radiation;
   a cure state monitor configured to identify the at least one portion of the structure for further processing; and
   a control system operatively coupled to the exposure chamber and the state monitor, wherein the control system is configured to control dosage of the radiation such that a high cure state and a low residual stress are achieved for the structure, wherein a dosage level of the radiation is determined based, at least in part, on the composition of the structure.

2. The assembly of claim 1, wherein the structure is an optical substrate.

3. The assembly of claim 2, wherein the optical substrate is formed of a glass or composite material.

4. The assembly of claim 1, wherein the assembly is configured to receive a support structure configured to attach to the structure, wherein the support structure is formed of a metal, glass, or composite material.

5. The assembly of claim 1, further comprising an additional exposure chamber adjacent to said exposure chamber, wherein said additional exposure chamber is configured to expose the at least one portion of the structure to ultra violet (UV) light such that at least a partial cure state is achieved for the structure prior to exposure in said exposure chamber, wherein a dosage level of the UV light is based, at least in part, on the composition of the structure.

6. The assembly of claim 1, further comprising a mixing apparatus configured to mix an adhesive material, to be applied to the structure, with a plurality of nano-filler particles prior to the structure's exposure in said exposure chamber.

7. The assembly of claim 1, further comprising an additional exposure chamber configured to expose the structure to heat, wherein a level of heat exposure is based, at least in part, on the composition of the structure.

8. A method comprising: receiving a structure; using a cure state monitor to identify at least one portion of the structure for further processing; and exposing the at least one portion of the structure to radiation such that a high cure state and a low residual stress are achieved for the structure, wherein a dosage level of the radiation is determined based, at least in part, on the composition of the structure.

9. The method of claim 8, wherein the structure is an optical substrate formed of a glass or composite material.

10. The method of claim 8, further comprising receiving a support structure configured to attach to the structure, wherein the support structure is formed of a metal, glass, or composite material.

11. The method of claim 8, further comprising exposing the at least one portion of the structure to ultra violet (UV) light such that at least a partial cure state is achieved for the structure prior to exposing the at least one portion of the structure to radiation such that a high cure state is achieved for the structure, wherein a dosage level of the UV light is based, at least in part, on the composition of the structure.

12. The method of claim 8, further comprising mixing an adhesive material, to be applied to the structure, with a plurality of nano-filler particles prior to exposing the at least one portion of the structure to radiation such that a high cure state is achieved for the structure.

13. The method of claim 8, further comprising exposing the structure to heat, wherein a level of heat exposure is based, at least in part, on the composition of the structure.

14. A system comprising:
    a control system configured to control a dosage of radiation based, at least in part, on composition of a structure; and
    an assembly comprising:
        an exposure chamber configured to:
            receive the structure and expose at least a portion of the structure to radiation;
            a cure state monitor configured to identify the at least one portion of the structure for further processing,
            wherein the control system controls the dosage of the radiation such that a high cure state and a low residual stress are achieved for the structure.

15. The system of claim 14, wherein the structure is an optical substrate.

16. The system of claim 15, wherein the optical substrate is formed of a glass or composite material.

17. The system of claim 14, wherein the assembly is configured to receive a support structure configured to attach to the structure, wherein the support structure is formed of a metal, glass, or composite material.

18. The system of claim 14, wherein the assembly further comprises an additional exposure chamber adjacent to said exposure chamber, wherein said additional exposure chamber is configured to expose the at least one portion of the structure to ultra violet (UV) light such that at least a partial cure state is achieved for the structure prior to exposure in said exposure chamber, wherein a dosage level of the UV light is based, at least in part, on the composition of the structure.

19. The system of claim 14, wherein said assembly further comprises a mixing apparatus configured to mix an adhesive material, to be applied to the structure, with a plurality of nano-filler particles prior to the structure's exposure in said exposure chamber.

20. The system of claim 14, wherein said assembly further comprises an additional exposure chamber configured to expose the structure to heat, wherein a level of heat exposure is based, at least in part, on the composition of the structure.

* * * * *